United States Patent
Shikina

(10) Patent No.: US 7,279,641 B2
(45) Date of Patent: Oct. 9, 2007

(54) WIRING BOARD AND WIRING APPARATUS

(75) Inventor: Noriyuki Shikina, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/550,637

(22) Filed: Oct. 18, 2006

(65) Prior Publication Data

US 2007/0117415 A1    May 24, 2007

(30) Foreign Application Priority Data

Oct. 21, 2005    (JP) .............................. 2005-307888

(51) Int. Cl.
*H05K 1/02*        (2006.01)
(52) U.S. Cl. ..................... 174/254; 361/777; 439/49; 349/150
(58) Field of Classification Search ................. 439/65, 439/49, 55; 361/777; 349/150–151; 174/254
See application file for complete search history.

(56) References Cited

U.S. PATENT DOCUMENTS

| | | | |
|---|---|---|---|
| 5,847,451 A * | 12/1998 | Ohtaki et al. ................ | 257/697 |
| 6,407,795 B1 * | 6/2002 | Kamizono et al. .......... | 349/149 |
| 7,070,422 B1 * | 7/2006 | Kuo et al. .................... | 439/67 |
| 2005/0045374 A1 * | 3/2005 | Kumar et al. ................ | 174/254 |
| 2006/0027395 A1 * | 2/2006 | Cho ............................. | 174/254 |

FOREIGN PATENT DOCUMENTS

| | | | |
|---|---|---|---|
| JP | 2-60186 | * | 2/1990 |
| JP | 9-319520 | | 12/1997 |
| JP | 10-49301 | | 2/1998 |

* cited by examiner

*Primary Examiner*—Michael C. Zarroli
(74) *Attorney, Agent, or Firm*—Morgan & Finnegan LLP

(57) ABSTRACT

A wiring board includes conductive wirings, terminals and interconnecting lines connecting between them. First terminals establish a one-to-one correspondence with the interconnecting lines. The interconnecting lines terminate at the first terminals except at least one of the interconnecting lines. The interconnecting line which does not terminate at the first terminals terminates at the second terminal. The first terminal at which the interconnecting lines do not terminate is connected to the third terminal.

The first terminals are connected to outputs of a driver IC mounted on a tape carrier package. The second and third terminal are connected to a switch via a through lead line of tape carrier package. When the second and third terminals are short-circuited by the switch, all the outputs of the driver IC is connected to the conductive wiring of the wiring board. When the second terminal is connected to the detection circuit by the switch, a signal on the wiring board is detected to determine a position of a pen.

9 Claims, 10 Drawing Sheets

WIRING BOARD AND WIRING APPARATUS

FIELD OF THE INVENTION AND RELATED ART

The present invention relates to a wiring board including a substrate provided with a wiring pattern and a wiring apparatus including the wiring board and a circuit. More specifically, the present invention relates to a display panel provided with wiring for display and a display apparatus in which a circuit for sending a signal to the wiring is attached to the display panel.

A display apparatus having a position indication function for effecting input operation by touching a button on a display screen with a hand-held pen or a finger has been put into practical use as game machines, personal computers, automated teller machines, ticket-vending machines, etc. In most of these apparatuses, an input function is provided by superposing a transparent touch sensor on a display panel. In such apparatuses, however, a sensed position of an object on the display panel often deviates from its true position because the display panel and the sensor panel are stacked with a distance. They are not suitable for fine indication of position or handwritten character input.

The display panel is provided with wiring for sending signals in a vertical direction and a horizontal direction, so that it is possible to effect input free from positional deviation if the wiring can be used for detecting a position.

Japanese Laid-Open Patent Application (JP-A) Hei 9-319520 discloses a method of detecting a current passing through wiring. More specifically, a matrix display substrate on which a photoelectric conversion element is disposed is irradiated with light from an input pen to change an electric resistance at a light irradiation portion and a scanning voltage is successively applied to either one of electrodes disposed in X and Y directions to detect a current passing through the other electrode, thus detecting a light-irradiated position.

In JP-A Hei 10-49301, a loop circuit is formed using a pair of scanning lines or signal lines of a matrix display. An electromagnetic signal induced by an input pen is detected through a detecting circuit, which is prepared in the driving IC chip. Scanning lines or signal lines are short-circuited at the opposite end to the detecting circuit by a switch. By changing the pair of the lines forming the loop sequentially, position of the loop circuit is scanned the screen. The position pointed by the pen is determined from the maximum output loop in the scanning lines and signal lines.

In the above-described methods, the scanning lines or the signal lines are used for both of display and detection, so that these wirings are connected to a drive circuit during a display operation and connected to a detection circuit during a detection operation. In JP-A Hei 10-49301, the drive and detection circuits are in the driver IC and connected to a panel through a terminal. A switch is formed therein so that the switch can switch between connection of the terminal with the drive circuit and connection of the terminal with the detection circuit.

In most of the display apparatuses a drive signal is supplied from the outside of the display panel. In an active matrix display apparatus, a scanning signal to be applied to scanning lines is supplied from horizontal sides of a panel and a video data signal to be applied to source lines is supplied from vertical sides of the panel. For this purpose, a tape carrier package (TCP) mounting a driver IC (integrated circuit) is frequently employed.

This TCP mounting method is a typical drive circuit mounting method for display apparatus. TCP is a film as a base material at a center of which a driver IC chip is mounted. Lead lines are patterned on the film base material through photolithography. They are extended from terminals connected with the integrated circuits, which are called inner leads, to connection terminals at a periphery of the film base material, which are called outer leads. Some of the outer leads are connected to the display panel and the other outer leads are connected to a printed wiring board.

When a pen input function, wherein scanning/signal lines are used as an antenna for position detection, is added to a display panel using driver ICs of the TCP mounting method, there arises the following problem.

In order to switch between drive and detection, it is required that the driver ICs are provided with a position detection function as proposed in prior arts or a signal is detected from terminals other than the connection terminals of TCP.

However, the driver ICs having the position detection function are currently expensive. When such a driver/detection IC is newly prepared, integration density is lowered and the number of driver ICs necessary to a display panel is increased from one to two or more. Thus, the preparation of a new IC having the position detection function requires excessive cost.

Further, even when the scanning/signal lines for position detection are provided with terminals, other than those of TCP, to which a detection circuit is connected, it is necessary to disconnect the scanning/signal lines from the driver ICs on the TCP during detection. For this purpose, it is possible to consider that a switch train for connecting/disconnecting the driver ICs to/from the display panel is created in the display panel through TFTs and the scanning/signal lines are led to a side where the TCP is not connected and are connected with a detection circuit. However, the connection of the TCP undesirably requires a large space at a peripheral portion, i.e., a frame of the display panel.

SUMMARY OF THE INVENTION

An object of the present invention is to provide a display-integrated position detection apparatus without adding any new function to the driver IC nor changing wiring pattern of the TCP. The present invention provides a display-integrated position detection apparatus which requires little modification of the peripheral members of the display panel.

According to an aspect of the present invention, there is provided a wiring board, comprising:

a plurality of conductors disposed on a substrate;

a plurality of interconnecting lines extended from said plurality of conductors to a peripheral portion of the substrate;

a plurality of first terminals provided at the peripheral portion of the substrate, wherein the number of the first terminals is the same as that of the interconnecting lines; and a second terminal and a third terminal adjoining the first terminals, wherein the interconnecting lines are disposed so that they establish one-to-one correspondence with the first terminals and terminate at associated first terminals except at least one of the interconnecting lines, and wherein said at least one of the interconnecting lines which does not terminate at the first terminals is connected to the second terminal, and the first terminal at which said at least one of the interconnecting lines does not terminate is connected to the third terminal.

According to another aspect of the present invention, there is provided a display apparatus, comprising:

the wiring board described above;

a first circuit apparatus, attached to the wiring board, including a drive circuit for generating and outputting a voltage or current to be supplied to the conductors;

first lead lines for connecting the first terminal to an output of the drive circuit, and a pair of lead lines for leading the second terminal and the third terminal to a second circuit apparatus, respectively;

a detection circuit, disposed outside the wiring board, for detecting a voltage or current generated in a conductor; and the second circuit apparatus, attached to the first circuit apparatus, including a detection circuit for detecting a voltage or current generated in the conductors and a switch connected to the pair of lead lines of the first circuit apparatus for switching between an operation for short-circuiting the pair of lead lines and an operation for connecting one of the pair of the lead lines which is connected to the second terminal to an input of the detection circuit.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

In the present invention, such a board that a wiring pattern is formed, on a substrate, with an electroconductive member is referred to as a "wiring board". When the wiring board has a function of display or position detection, it is called a display panel or a position detection panel.

The wiring board is connected to an external circuit, from which an input signal is sent to the wiring on the board. As a result, a display device and another active element disposed on the board are driven. Alternatively, a signal generated on the wiring board is sent to the external circuit through the wiring. As a result, a signal generation position or signal intensity is detected.

In the present invention, an apparatus including such a wiring board and the external circuit attached thereto and exhibiting the display function or the position detection function when it is driven is referred to as a "wiring apparatus". The wiring apparatus having the display function is referred to as a "display apparatus", and the wiring apparatus having the position detection function is referred to as a "position detection apparatus". Further, the wiring apparatus having both the display function and the position detection function is also sometimes referred to as the display apparatus.

Hereinbelow, embodiments of the present invention will be described. Herein, the present invention does not depend on the type of a display apparatus but is applicable to a liquid crystal display apparatus, an electrophoretic display apparatus, and other many display apparatuses. Further, the present invention is also applicable to any panel in which an electrode has both of a function of applying a voltage or a current and a function of detecting the voltage or the current.

Further, the display apparatus of the present invention may be of an active matrix type or a simple matrix type or may include a display panel in which an electrode having any shape is disposed. The display apparatus may also be such a display apparatus or input apparatus that XY coordinates are identified by applying a voltage to an X-direction electrode so as to detect a voltage or a current in Y-direction or applying a voltage to a Y-direction electrode so as to detect a voltage or a current in X-direction.

1. First Embodiment

Figure 1:
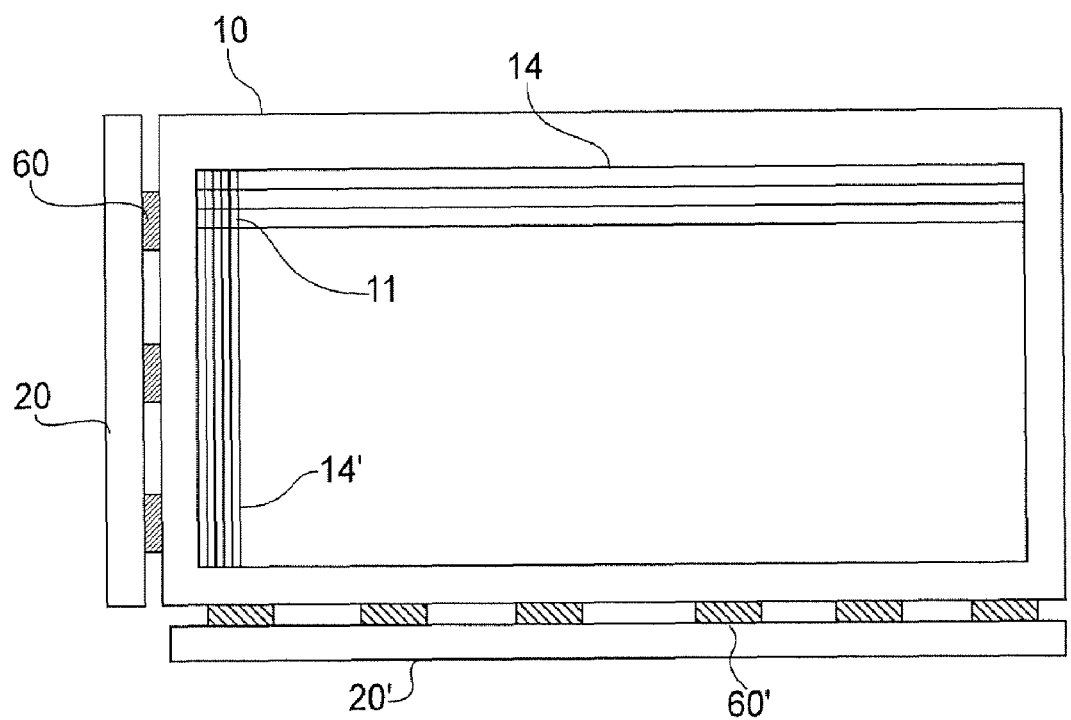
FIG. 1 is a schematic view of a matrix of display apparatus of First Embodiment.

FIG. 1 is a constitutional view of a matrix display apparatus.

On a display panel 10, scanning signal lines (scanning lines) 14 disposed in parallel with each other on a substrate and signal lines 14' disposed in parallel with each other on the substrate and perpendicular to the scanning signal lines 14 are formed in a manner of crossing with an overpass or underpass. At each of intersections of the scanning lines 14 and the signal lines 14', a pixel 11 of a display device is disposed.

Figure 2:
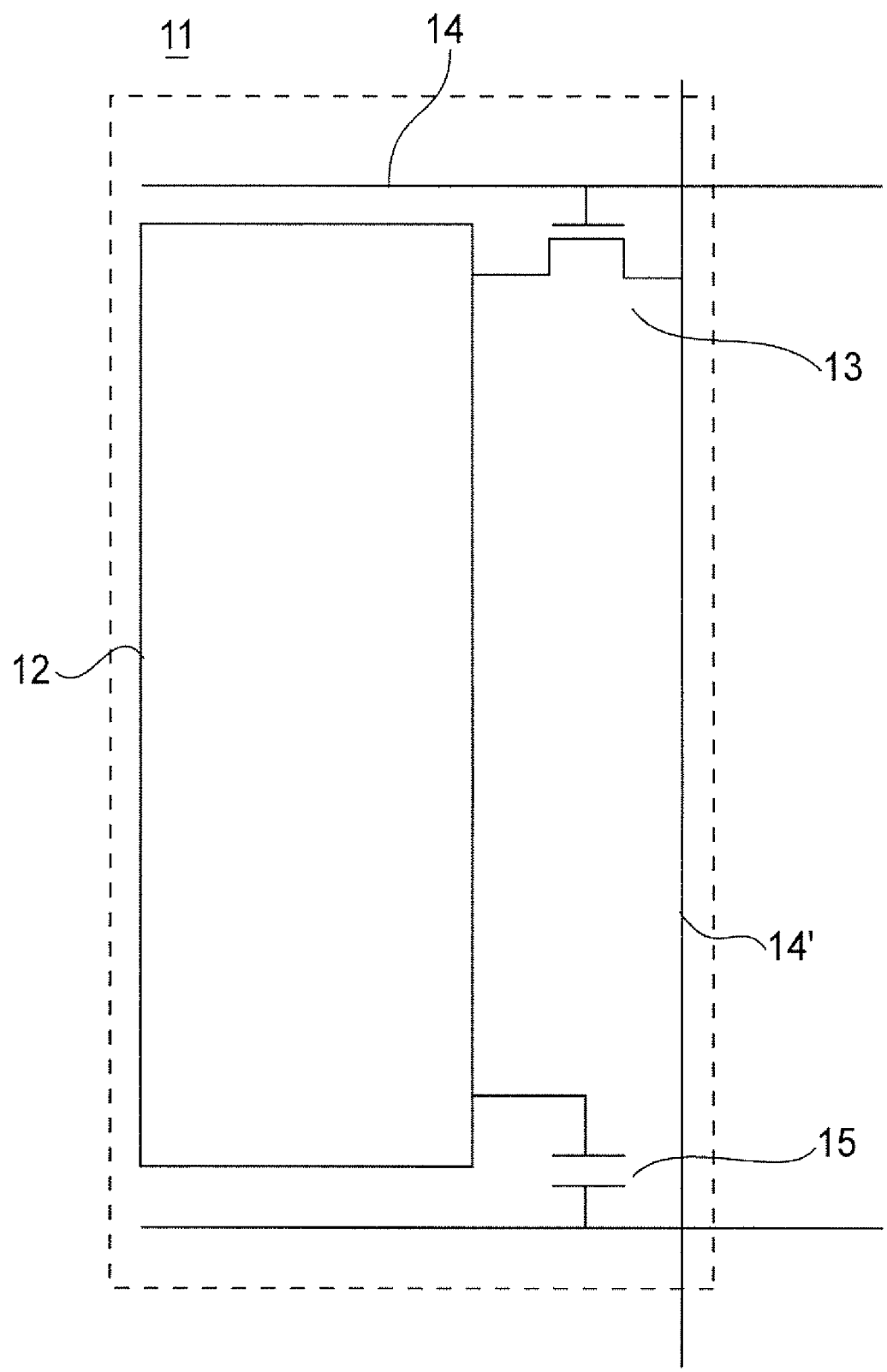
FIG. 2 is a schematic view showing a pixel electrode and a pixel circuit.

An enlarged view of the pixel 11 is shown in FIG. 2. In the pixel 11, a pixel electrode 12 and a thin film transistor (TFT) 13 are formed. A gate electrode of the TFT 13 is connected to the scanning line 14 and a source electrode of the TFT 13 is connected to the signal line 14'. Further, at a drain electrode, an auxiliary capacity 15 for holding a writing signal received at timing of a scanning signal is formed. The display panel 10 shown in FIG. 1 is an active matrix display panel.

Figure 7:
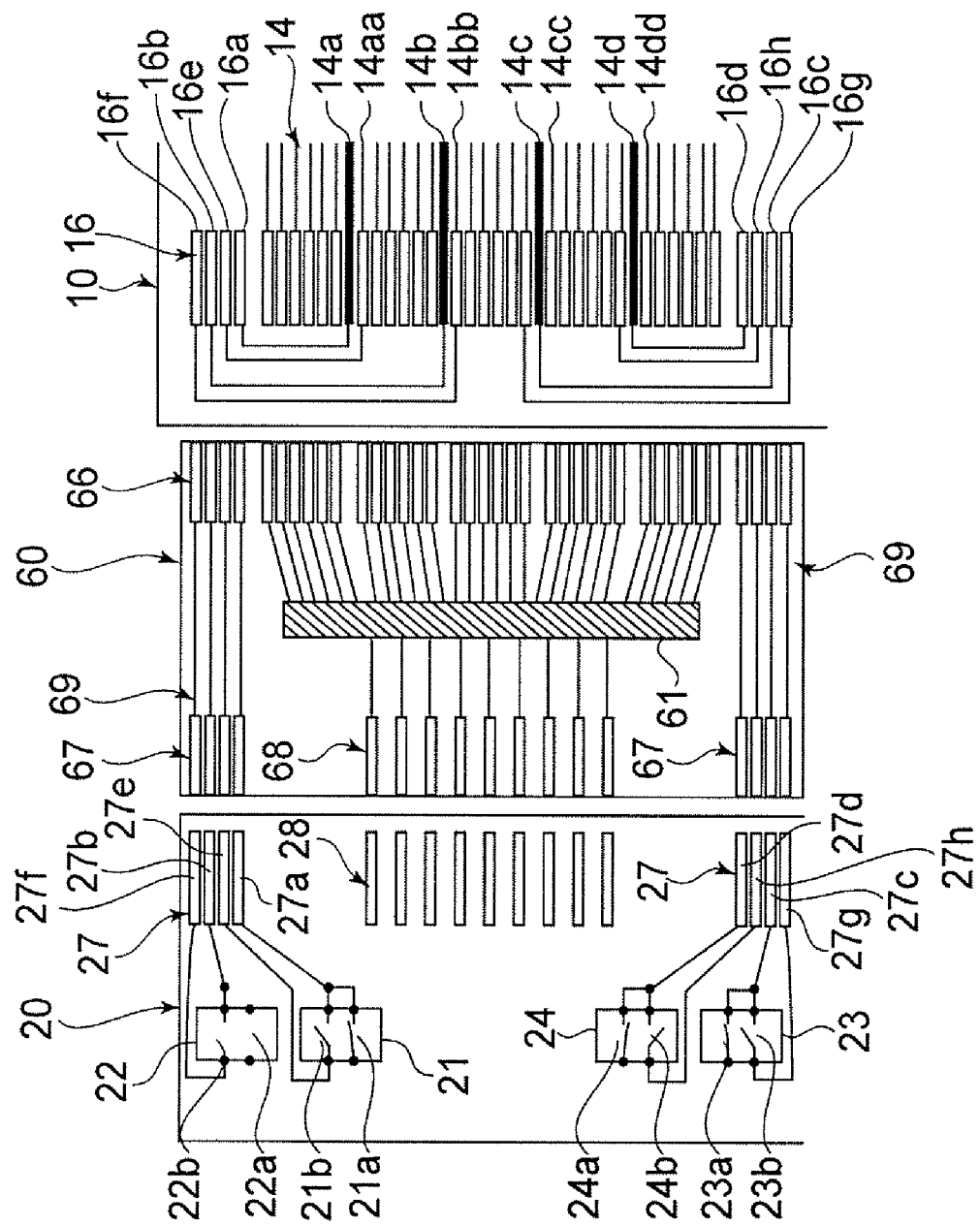
FIG. 7 is a schematic view showing wiring at a periphery of switching substrate side terminals in Second Embodiment.

On the left side of the display panel 10, a TCP 60 on which a driver IC for driving the scanning lines 14 is mounted is attached. In FIG. 7, the scanning lines 14 are connected to the TCP 60 so that they are divided into three groups. However, the number of the groups may appropriately be determined depending on the number of the scanning lines and the number of output of the driver IC. The TCP is connected to a driver board 20 on an opposite side to the display panel 10. The driver board 20 is formed of a resin substrate on which interconnecting lines are printed. Through the driver board 20, power and an input signal are transmitted to the driver IC on the TCP.

On the signal line side, similarly, driver ICs are attached through six TCPs 60' which are connected to a driver board 20'.

Hereinbelow, description is made on the assumption that the display panel is the active matrix display panel and the scanning lines (gate lines) and the signal lines (source lines) are disposed perpendicular to each other.

In the present invention, the scanning lines and the signal lines are equal in structure to each other, i.e., have the same wiring structure and the same connection structure. For this reason, members on the signal line side correspond to those on the scanning line side are distinguished by simply adding an apostrophe(') to associated reference numerals for the members on the scanning line side. In the following description, the members on the scanning line side are described as an example. However, the description also holds true for the members on the signal line side.

Figure 3:
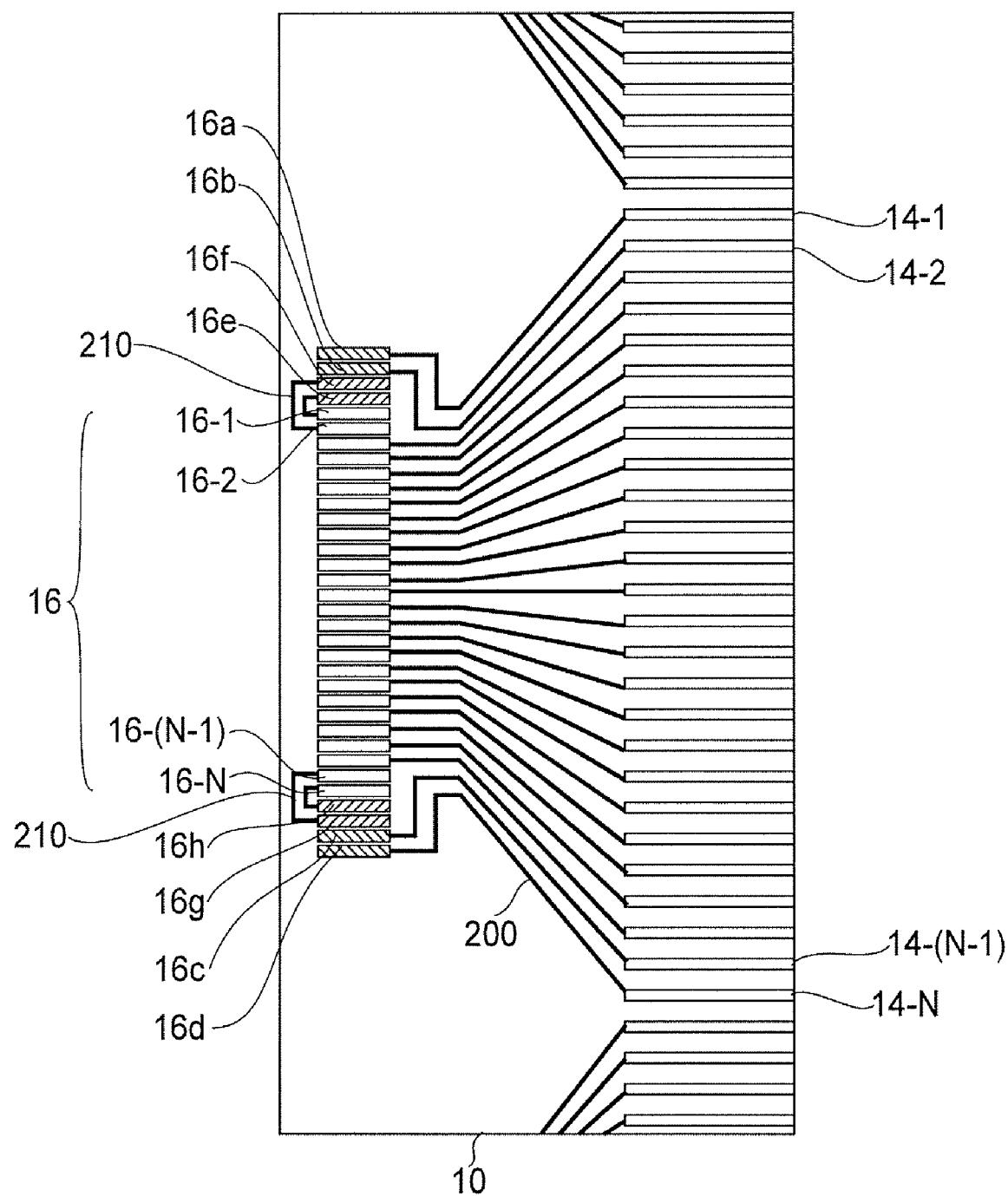
FIG. 3 is a schematic view showing wiring at a peripheral portion of terminals in First Embodiment.

FIG. 3 is an enlarged view of an end portion of the display panel 10.

On the display panel 10, the scanning lines 14 extend in an X-direction and are connected with lead-out interconnecting lines 200 at their ends. These lead-out interconnecting lines 200 connected with the scanning line 14 terminate at a plurality of connection terminals 16 disposed at a peripheral portion of the display panel 10. In the present invention, a part of the connection terminals 16 has a particular constitution which will be described later more specifically.

Figure 4:
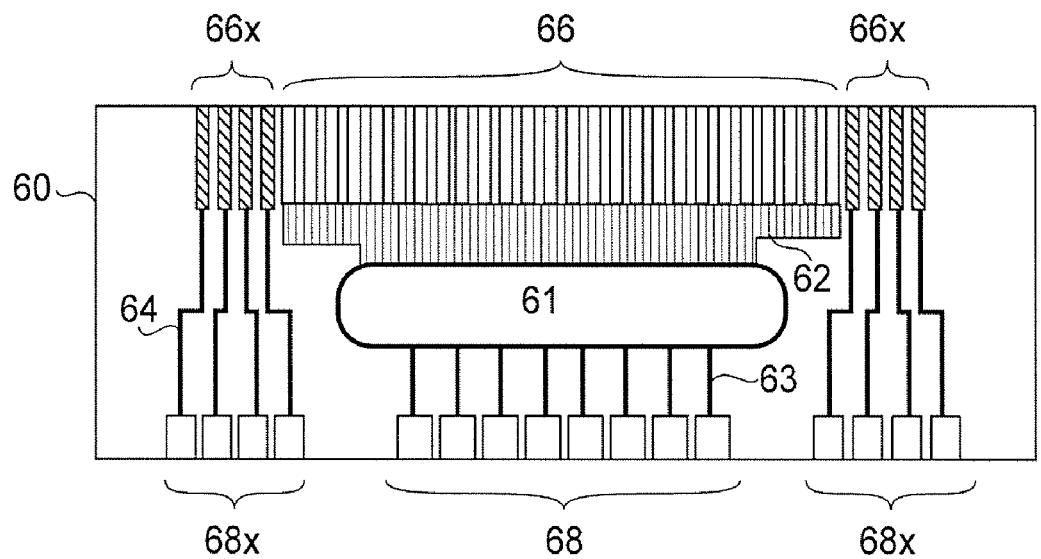
FIG. 4 is a wiring diagram of TCP on which a driver IC is mounted.

FIG. 4 is a schematic wiring diagram of the TCP 60 connected to the display panel 10.

At a central portion of the TCP 60, a driver IC 61 is mounted. Output terminal inner leads of the driver IC 61 and panel-side outer leads are connected by interconnecting lines 62. Further, input terminals of the driver IC 61 are connected with outer leads on the printed wiring board 20 side by interconnecting lines 63.

Most of TCPs are provided with dummy outer leads 66x and 68x outside the outer leads 66 and 68, respectively. The panel-side dummy outer leads 66x and connected with the display panel to reinforce the connection of the display panel with the TCP. They are also used for supplying voltages to interconnecting lines, other than the scanning/signal lines provided on the display panel, such as connecting signal lines for connecting the scanning lines and the signal lines and connecting signal lines for connecting adjacent TCPs.

Thus, the dummy outer leads are also used for supplying the voltage or current to the display panel, so that they are disposed both on the display panel side as those 66x and on the printed wiring board side as those 68x on the printed circuit board side as those 68x. The dummy outer leads 66x and 68x are connected by through interconnecting lines 64 not via the driver IC.

The display panel of the present invention is based on the precondition that it is connected with the TCP including the dummy outer leads 66x and 68x and the through interconnecting lines 64. Most of commercially available TCPs have such a structure, so that they can be connected with the display panel of the present invention.

Figure 5:
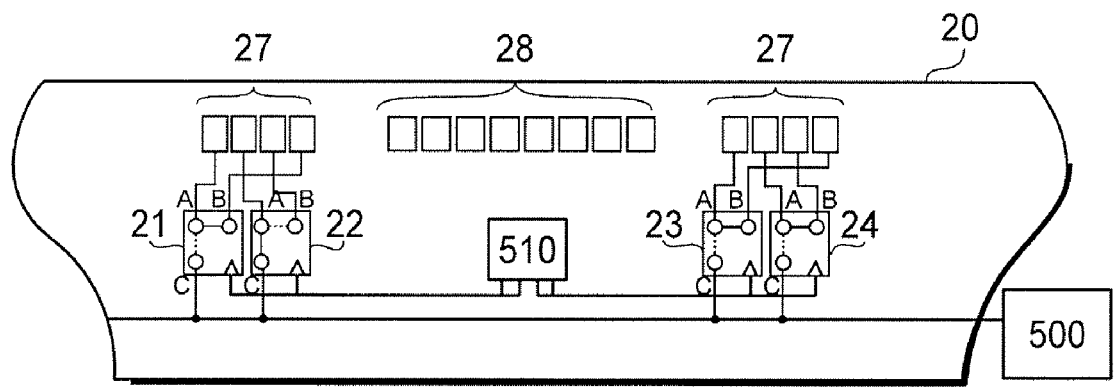
FIG. 5 is a circuit diagram of a driver board in First Embodiment.

FIG. 5 is a schematic view showing terminals and circuits of the printed wiring board 20.

To the printed wiring board 20, the input-side outer leads 68 of the TCP 60 are connected. The printed wiring board 20 is provided with a plurality of terminals 28 for supplying power and input signal to the driver IC 61 and a plurality of toners 27 to which the dummy outer leads 68x are connected. The terminals 27 of the printed wiring board used in combination with the display panel of the present invention are connected to the switch circuits 21, 22, . . . on the substrate with two terminals as one pair. Each of the switch circuits 21, 22, . . . effects switching such that one terminal A of the two terminals (as one pair) is short-circuited with the other terminal B or connected with an external terminal C. Timing of switching is controlled by a control circuit 510.

Hereinbelow, an embodiment of the present invention will be described with reference to FIGS. 3-5.

The display panel 10 is provided with the connection terminals 16 for receiving the driving signal at the peripheral portion thereof. The connection terminals 16 are required that they are disposed in the same number and pitch as the panel-side outer leads 66 of the TCP 60 shown in FIG. 4.

The connection terminals 16 are provided in the same number as the scanning lines 14 of one group and in the same number as the lead-out interconnecting lines 200.

The arrangement of the output terminals 66 of the driver IC 61 correspond to that of the scanning lines 14 on the display panel, so that the connection terminals 16 are required that they not only have the same number as the scanning lines 14 (the number is taken as N) pertaining to one group on the display panel but also are arranged in one-to-one correspondence manner in the order of the scanning lines 14 of the display panel. More specifically, the lead-out interconnecting lines 200 are extended to a position of the connection terminals 16 while keeping the arrangement order of the scanning lines 14 without intersection with each other on the way to the scanning lines 14.

In FIG. 3, the scanning lines 14-1 to 14-N (N: the number pertaining to one group to be connected with one TCP) correspond to the connection terminals 16-1 to 16-N, respectively.

The display panel 10 of the present invention is provided with eight other connection terminals 16a to 16g (generally even in number) outside the connection terminals 16 to which the outputs of the driver IC of the TCP 60 are connected (hereinafter, the connection terminals 16 are referred to as "first connection terminals"). These connection terminals 16a to 16g other than the first connection terminals are also connected to the outer leads of the TCP, so that they are arranged at the same pitch as the first connection terminals.

The interconnecting lines 200 connected to the scanning lines 14 terminate at the first connection terminals except a part thereof. In FIG. 3, all the lead-out interconnecting lines other than four interconnecting lines including two interconnecting lines for the scanning lines 14-1 and 14-2 at one outer end portion and two interconnecting lines for the scanning lines 14-(N-1) and 14-N at the other outer end portion terminate at corresponding first connection terminals 16-3 to 16-(N-2), respectively.

The four lead-out interconnecting lines extended from the scanning lines 14-1, 14-2, 14-(N-1), and 14-N do not terminate at the first connection terminals. Instead, they are connected to four connection terminals 16-a, 16-b, 16-c, and 16-d, respectively, of the connection terminals provided outside the first connection terminals (hereinafter, these four connection terminals are referred to as "second connection terminals").

Further, of the first connection terminals, first connection terminals 16-1, 16-2, 16-(N-1) and 16-N at which the lead-out interconnecting lines 200 do not terminate are connected to remaining four connection terminals 16e, 16f, 16g and 16h, respectively, provided outside the first connection terminals (hereinafter, the remaining four connection terminals are referred to as "third connection terminals"). This connection is effected via interconnecting lines 210 provided at a further outside panel peripheral portion of the connection terminals 16.

By the above described wiring, the second connection terminals are connected to the scanning lines (or the lead-out interconnecting lines) which do not terminate at the first connection terminals and the third connection terminals are connected to the first connection terminals at which the scanning lines (or the lead-out interconnecting lines) do not terminate. As described above, the scanning lines and the first connection terminals establish one-to-one correspondence including the arrangement order, so that the second connection terminals and the third connection terminals also establish one-to-one correspondence based on that between the scanning lines and the first connection terminals. In FIG. 3, the one-to-one correspondence is established between 16a and 16f, 16b and 16f, 16c and 16g, and 16d and 16h, respectively.

The second connection terminals and the third connection terminals are led out, as they are, to the terminals 27 of the printed wiring board 20 via the through interconnecting lines 64 when the TCP is mounted.

In correspondence with the second connection terminals and the third connection terminals which are provided on the display panel 10 as eight connection terminals in total (generally even in number), four switches 21-24 are provided on the printed circuit board 20. The respective switches effect switching such that the terminal A is short-circuited with the terminal B or connected with the terminal C. For each switch, the terminal A is connected to the line extended from the second connection terminal and the terminal B is connected to the third terminal correspond to the second connection terminal of the terminal A.

Based on these connections, the switches 21-24 select whether the second connection terminal is directly connected to the third terminal or connected to an external circuit. Further, as the external circuit, a detection circuit 50 for detecting a signal on the display panel is prepared.

As a result, it is possible to effect switching between two modes including a display operation for connecting the scanning lines of the display panel to the driver ICs by switching the switches 21-24 on the printed wiring board 20 and a position detection operation using the scanning lines on the display panel as a detection antenna.

In FIG. 3, the four scanning lines of all the scanning lines are selected to be lead out to the outside but the number of such selected scanning lines is not limited to four. For example, it is also possible to use five or more scanning lines in the detection operation. In the case of a position detection device such that inputs is effected by touching a screen with a finger, high accuracy is not required. For this reason, the number of the scanning lines may be decreased to approximately 1/100 of the entire scanning line number. When the number of scanning lines selected for detection is n, the second connection terminal and the third connection terminal are required to be n+n, i.e., 2n in total number. This is the reason why the connection terminals other than the first connection terminals are provided in even number.

2. Second Embodiment

In this embodiment, the present invention is applied to a display panel in which a drive circuit is connected at both sides of scanning lines. In order to prevent signal delay, application of the same voltage signal from both sides of one signal line or one scanning line is frequently effected in a large-screen panel.

Figure 6:
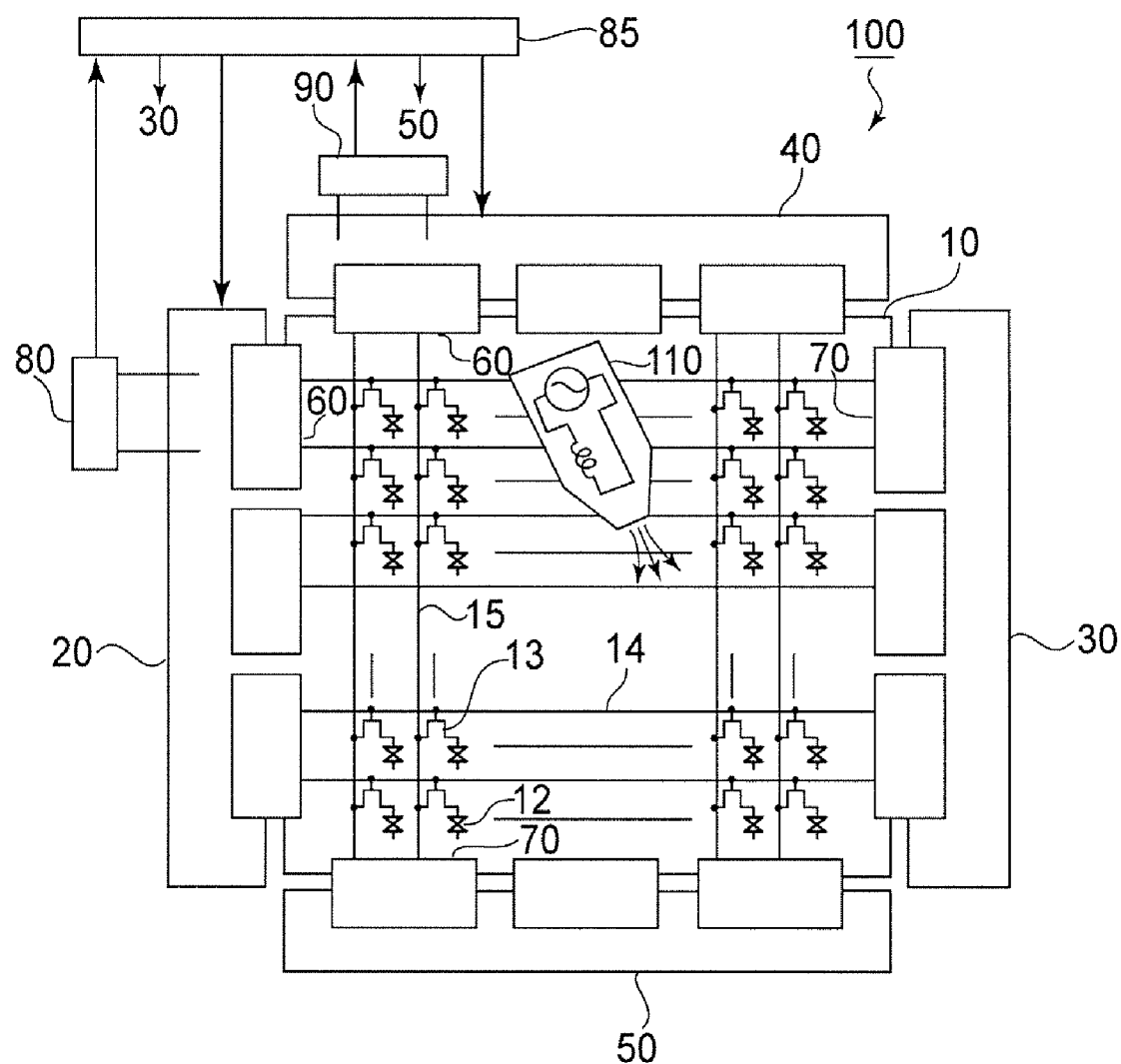
FIG. 6 is a schematic view of a matrix display apparatus of Second Embodiment.

FIG. 6 is a schematic view showing a constitution of the display panel of this embodiment.

A display apparatus 100 includes a display panel 10 having a large number of pixels 12 disposed horizontally and vertically in a lattice-like shape. Around the display panel 10, a printed wiring board 20 on a scanning line drive circuit side, a printed wiring board (short-circuit board) 30 on an opposite scanning line drive circuit side, a printed wiring board 40 on a signal line drive circuit side, and a printed wiring board (short-circuit board) 50 on an opposite signal line drive circuit side are disposed. Further, to the printed wiring boards 20 and 40 on the respective drive circuit sides, a scanning line coordinate detection circuit 80 and a signal line coordinate detection circuit 90 are connected, respectively. The display apparatus may further include a control circuit 85 for controlling a display image on the display panel 10.

Between the display panel 10 and the printed wiring board 20 and between the display panel 10 and the printed wiring board 40, three TCPs 60 are connected. Similarly, three TCPs 70 are connected between the display panel 10 and the short-circuit board 30 and between the display panel 10 and the short-circuit board 50.

The TCPs 60 and 70 relaying the connections between the display panel 10 and each of the printed wiring boards 20, 30, 40 and 50 is formed by mounting a driver IC 61 on a flexible film member provided with a lead-line pattern and are connected to the display panel 10 by tape automated bonding (TAB) method.

2-1. Operation on Switching Board Side

First, an operation on the printed wiring board 20 as a switching board will be described.

FIG. 7 is a schematic view showing wiring at a portion where the driver TCP 60 for the scanning lines and the switching board 20 are connected.

With respect to scanning lines 14a, 14b, 14c and 14d selected for effecting position detection, there are no corresponding first connection terminals and no outer leads on the TCP 60 side.

The first connection terminals are disposed with a spacing through which the scanning line 14a, 14b, 14c and 14d pass and are connected to second connection terminals 16a, 16b, 16c and 16d, respectively. The second connection terminals 16a, 16b, 16c and 16d are relayed to outer leads 66 of the TCP 60 and are further connected with through interconnecting lines 69, opposite-side outer lead 67, and terminals 27a, 27b, 27c and 27d of the switching printed wiring board 20 to be connected to associated A terminals (each being a common terminal for two terminals of 27a to 27d) of switches 21, 22, 23 and 24.

On the other hand, respective terminals of the driver IC 61 for supplying a scanning signal to scanning lines 14aa, 14bb, 14cc and 14dd adjacent to the scanning lines 14a, 14b, 14c and 14d, respectively, are connected to third connection terminals 16e, 16f, 16g and 16h. The third connection terminals 16e, 16f, 16g and 16h are relayed to the through interconnecting lines 69, the opposite-side outer leads 67, and terminals 27a, 27f, 27g and 27h of the switching printed wiring board 20. As a result, the respective terminals of the driver IC 61 for supplying a scanning signal to the scanning lines 14a, 14b, 14c and 14d are connected to B terminals 21b, 22b, 23b and 24b of the switches 21, 22, 23 and 24.

Accordingly, when the A terminal and the B terminal are connected by the switch 21, an output of the driver IC 61 is connected with the first connection terminal of the display panel 10 to drive a corresponding scanning line 14aa and enters a dummy outer lead of the TCP 60 via the third connection terminal 16e, enters the printed wiring board 20 via the through interconnecting lines 69, returned again to the dummy outer lead of the TCP 60 and the through interconnecting lines 69 via the switch 21, and supply a signal to the scanning line 14a via the second connection terminal 16a of the display panel 10. The scanning lines 14a and 14aa are driven by the same signal.

Operations of other switches 22-24 are the same as the switch 21.

The input terminals, grounding terminals, and power supply terminals of the driver IC 61 are relayed to the switching printed wiring board 20 via the input-side outer leads 68 and the printed wiring board 28 and are connected to the control board 85 via the switching printed wiring board 20. A display control circuit of the control board 20 develops image data to be displayed on the display panel 10 to form a scanning line image and generates s writing signal and a scanning signal.

Figure 8:
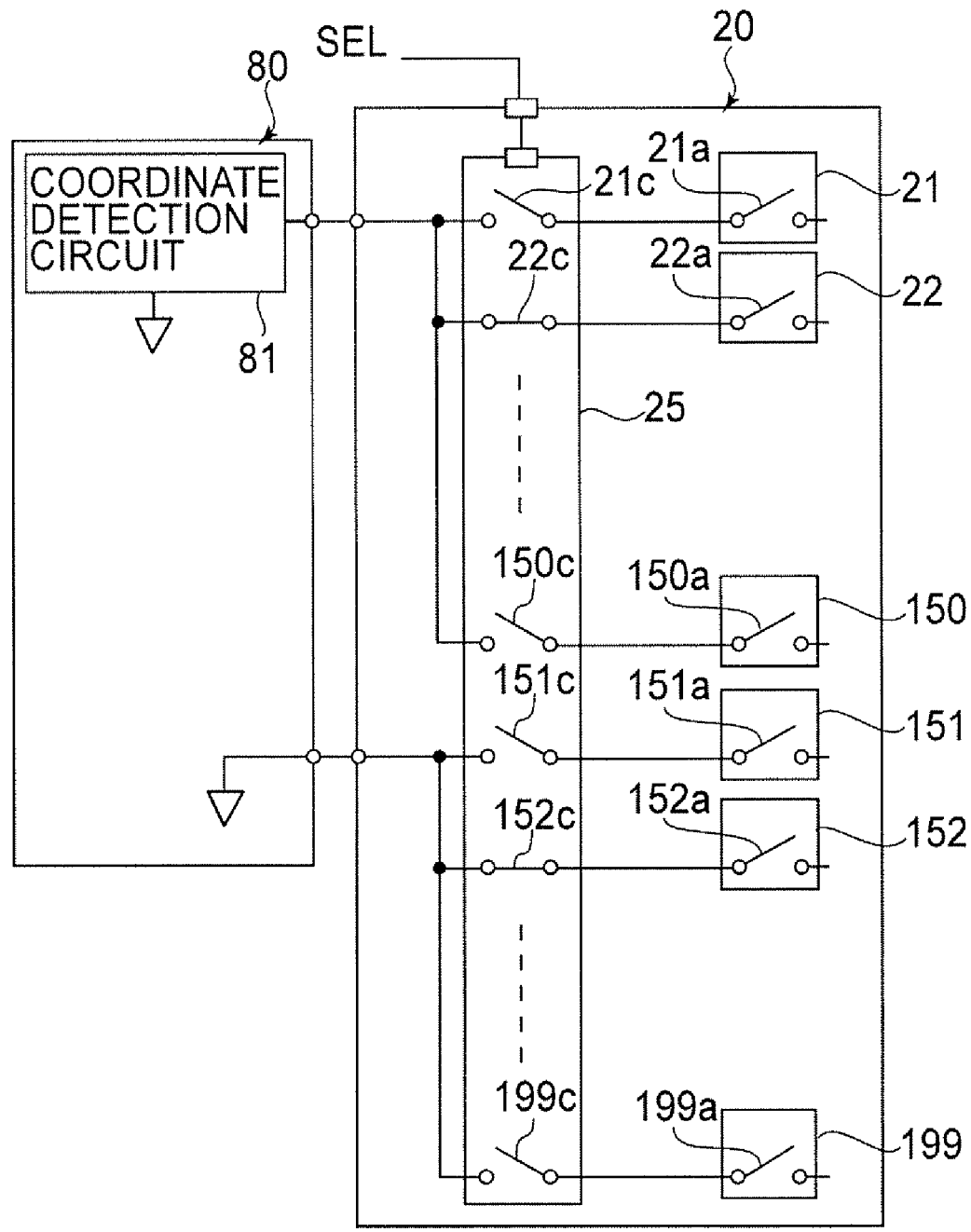
FIG. 8 is a circuit diagram of a switching substrate in Second Embodiment.

FIG. 8 is a circuit diagram of the switches 21, 22, . . . on the switching printed wiring board 20 shown in FIG. 6.

In FIG. 8, the A and B terminals of the switch 21 are omitted. The switch 21a between the B terminal and the C terminal is connected with one terminal of the switch 21c of a switch array 25 disposed on the same printed wiring board 20. The other terminal of the switch 21c is connect together with other terminals to a coordinate detection circuit 81 of the coordinate detection portion 80.

On the switching printed wiring board 20, switches 151, 152, . . . to be connected to the scanning lines are disposed with a certain spacing from the switches 21, 22, . . . A switch 151a between B and C terminals of the switch 151 is relayed to one terminal of a switch 151c and the other terminal of the switch 151c is connected together with other terminals to a common terminal which is connected to a grounding electrode-side terminal of the coordinate detection portion 80.

Two switches, carrying to scanning lines disposed with a certain spacing, e.g., the switches 22c and 152c are closed and other switches are opened, whereby a voltage between the corresponding two scanning lines is detected by the coordinate detection circuit 81.

The switches 21, 22, . . . of the switching printed wiring board 20 causes a short-circuit between the A and B terminals during image writing periods and a short-circuit between the A and C terminals during position detection periods each set between adjacent image writing periods, thus being connected to the switch array 25, During the coordinate detection, the scanning line subjected to the coordinate detection is disconnected from the output terminal of the driver IC.

The switch array 25 connects a pair of scanning lines 14 located on the display panel 10 with a predetermined spacing to the coordinate detection circuit 81. The pair of scanning lines 14 are successively switched to move the pair of scanning lines 14 subjected to the coordinate detection on the display panel 10.

2-2. Operation of Short-Circuit Board 30

ON an opposite side to the side where the switching printed wiring board 20 is disposed on the display panel 10, the TCP 70 mounting thereon the driver IC and the short-circuit printed wiring board 30 are attached.

Wiring of the TCP 70 has a mirror-image relationship with the TCP 60.

Figure 9:
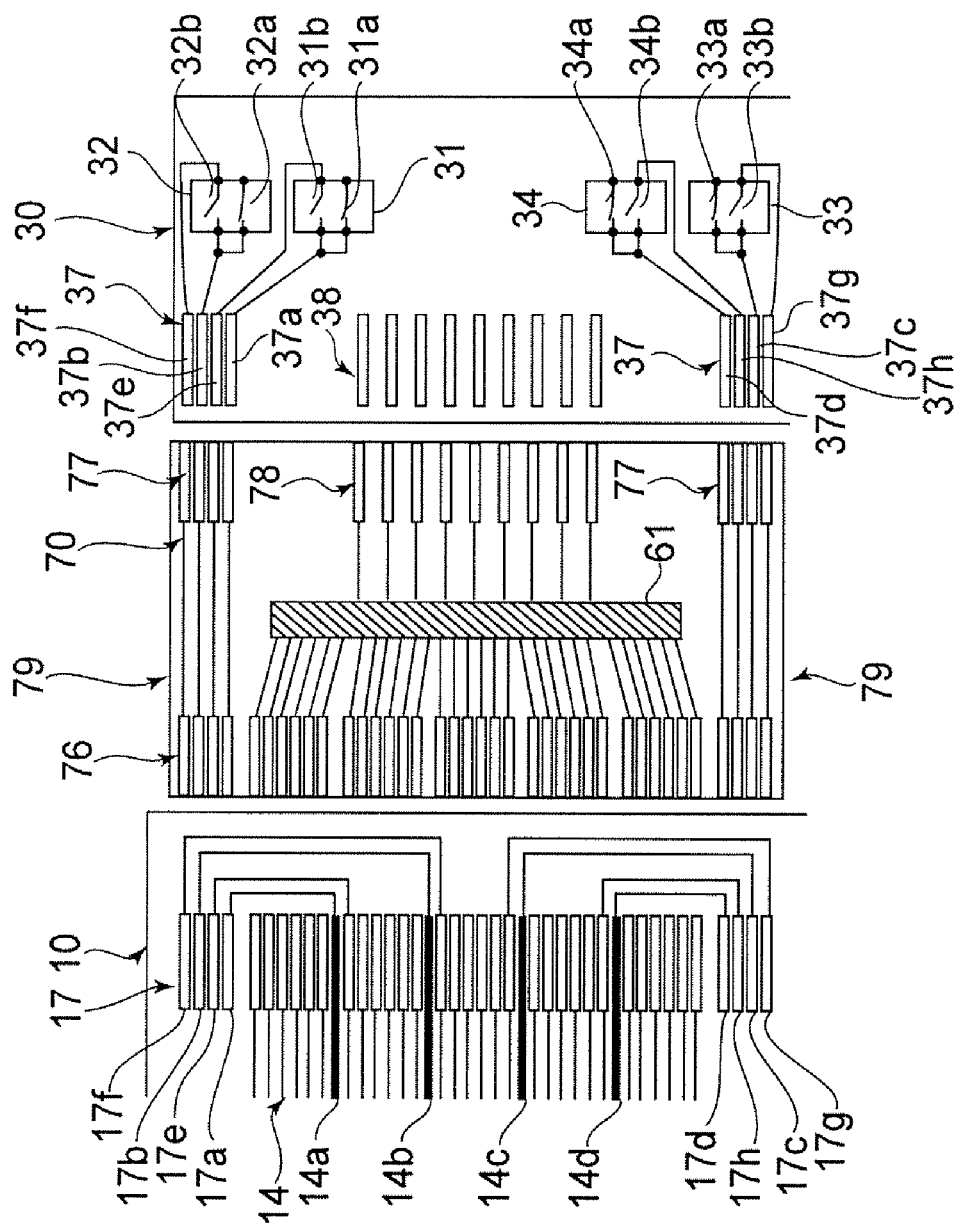
FIG. 9 is a schematic view showing wiring at a periphery of short-circuit substrate side terminals in Second Embodiment.

FIG. 9 is a schematic view showing the wiring of the short-circuit printed wiring board 30.

scanning lines 14a, 14b, 14c and 14d selected for effecting signal detection have no corresponding first connection terminals on the short-circuit printed wiring board 30 and no outer leads of the TCP 70 similarly as in the case of the switching printed wiring board 20. The first connection terminals are located with a spacing through with the scanning lines 14a, 14b, 14c and 14d passes and are connected to second connection terminals 17a, 17b, 17c and 17d, respectively. Subsequent connections and operations are identical to those in the case of the switching printed wiring board 20.

Figure 10:
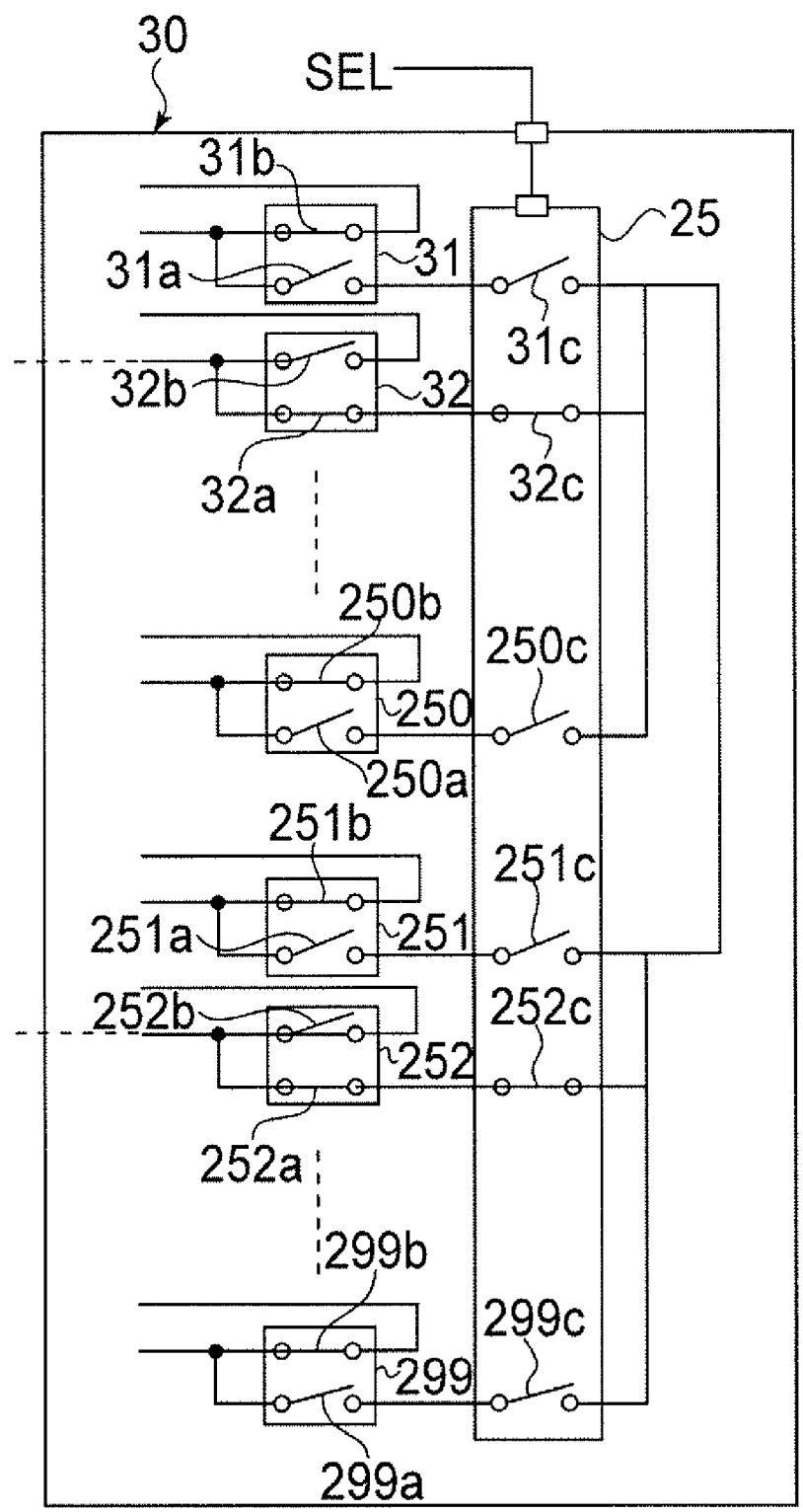
FIG. 10 is a circuit diagram of a short-circuit substrate in Second Embodiment.

FIG. 10 is a schematic view showing only switches on the short-circuit printed wiring board 30.

As shown in FIG. 10, switches 31a, 32a, . . . between the B and C terminals of the switches 31, 32, . . . are connected to terminals of switches 31c, 32c, . . . of the switch array 25. All other terminals of the switches 31c, 32c, . . . are short-circuited.

When the switch 32c of the switch array 25 and a switch 252c corresponding to a pair of scanning lines disposed on the display panel with a certain spacing from the switch 32c are closed and other switches are opened, the pair of scanning lines disposed with the certain spacing creates a loop circuit as shown in FIG. 10.

As a result, two inputs of the switching-side coordinate detection circuit 80 creates a loop circuit through the scanning lines, so that electromagnetic wave generated from an input pen on the display panel is detected as induced current.

The switch arrays 20 and 25 from a loop circuit by short-circuiting plural pairs of scanning signal lines 14 on the display panel 10 pair by pair. Further, by successively switching the pair of scanning lines 14 to be short-circuited, the loop circuit subjected to the position detection is moved on the display panel 10. As a result, the loop position on the display panel is scanned. A position at which a maximum induced current is generated during the scanning is detected as a position of the input pen.

As shown in FIG. 6, with respect to the signal lines 15 for supplying a writing voltage signal corresponding to image information, the switching printed wiring board 40, the short-circuit printed wiring board 50, and the coordinate detection portion 90 are disposed.

Operations similar to those in the case of the scanning line side are effected with respect to a plurality of selected wiring signal lines 15, whereby the position of the input pen is determined.

<Coordinate Detection Circuit>

Principle of coordinate position detection by pen inputting in the present invention will be described.

Figure 11:
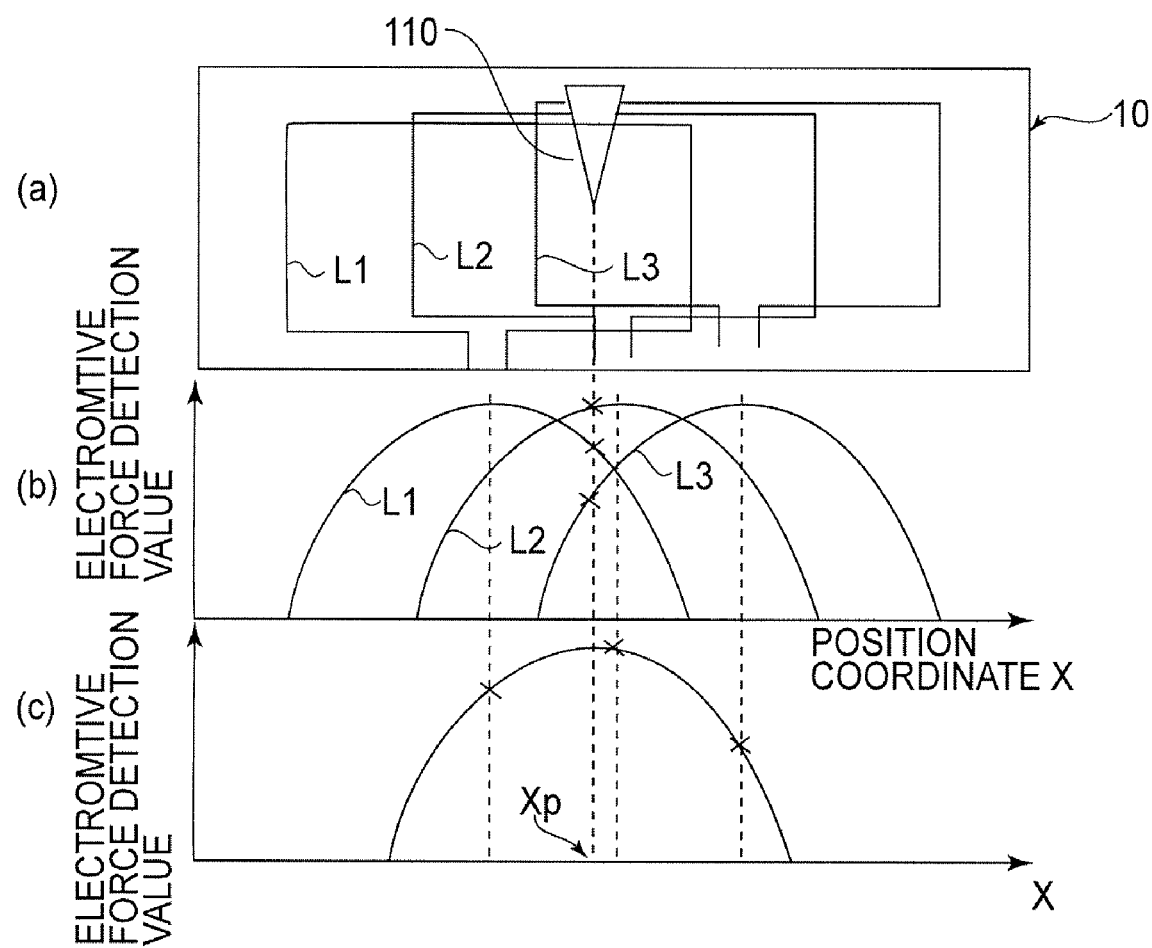
FIGS. 11(a) to 11(c) are schematic views for illustrating a coordinate detection operation in Second Embodiment.

FIG. 11(a) is a schematic view showing arrangement of a pen 110 on the display panel 10 (hereinafter referred to as a "position indicator") and loop circuits L1, L2 and L3. FIG. 11(b) is a graph showing electromotive force detection values of the loop circuits L1, L2 and L3 varying depending on X-coordinate positions of the position indicator 110. FIG. 11(c) is a graph for illustrating position detection processing on the basis of the electromotive force detection values of the loop circuits L1, L2 and L3.

As shown in FIG. 6, the display apparatus 100 includes the position indicator 110 on the image display screen. The position indicator 110 contains an AC power source therein and an output coil at a tip portion thereof. From the tip portion, electromagnetic wave is emitted to generate induced current in the loop circuit for Y-coordinate detection and the loop circuit for X-coordinate detection.

As shown in FIG. 11(a), on the display panel 10, the first loop circuit L1, the second loop circuit L2, and the third loop circuit L3 which have the same size are formed. The position indicator 110 is moved in the X-direction.

In this case, as the position indicator 110 is closer to a center of the loop circuit, an amount of magnetic flux penetrating the loop circuit is larger. As a result, as shown in FIG. 11(b), the first loop circuit L1, the second loop circuit L2, and the third loop circuit L3 provides peaks, of electromotive force (voltage or current), different in X-position of the position indicator by induction of the electromagnetic wave from the position indicator 110.

When the position indicator 110 indicates a coordinate position Xp, the coordinate detection portion 90 detects electromotive force values of the first loop circuit L1, the second loop circuit L2, and the third loop circuit L3 as intersections of the coordinate position Xp with a broken line.

The detection values of electromotive force the first to third loop circuits L1 to L3 are subjected to interpolation approximation with quadric curves as those at center positions of the first to third loop circuits L1 to L3. The X-coordinate positions of peaks of the quadric curves are subjected to arithmetical operation to determine X-coordinate positions of the position indicator.

As described above, the electromotive force value of the loop circuit on the display panel 10 using the writing signal lines 15 selected with the predetermined spacing is detected by the coordinate detection portion 90 and subjected to interpolation calculation to determine the X-coordinate value of the position indicator.

Similarly, an electromotive force value of a loop circuit on the display panel 10 using scanning signal lines 14 selected with a predetermined spacing is detected by the coordinate detection portion 80 and subjected to interpolation calculation by the control board 85 to determine a Y-coordinate value of the position indicator 110.

While the invention has been described with reference to the structures disclosed herein, it is not confined to the details set forth and this application is intended to cover such modifications or changes as may come within the purpose of the improvements or the scope of the following claims.

This application claims priority from Japanese is Patent Application No. 307888/2005 filed Oct. 21, 2005, which is hereby incorporated by reference.

What is claimed is:

1. A wiring board, comprising:
   a plurality of conductors disposed on a substrate;
   a plurality of interconnecting lines extended from said plurality of conductors to a peripheral portion of the substrate;
   a plurality of first terminals provided at the peripheral portion of the substrate, wherein the number of the first terminals is the same as that of the interconnecting lines; and
   a second terminal and a third terminal adjoining the first terminals,
   wherein the interconnecting lines are disposed so that they establish one-to-one correspondence with the first terminals and terminate at associated first terminals except at least one of the interconnecting lines, and
   wherein said at least one of the interconnecting lines which does not terminate at the first terminals is connected to the second terminal, and the first terminal at which said at least one of the interconnecting lines does not terminate is connected to the third terminal.

2. A wiring apparatus, comprising:
   a wiring board according to claim 1;
   a first circuit apparatus, attached to the wiring board, including
   a drive circuit for generating and outputting a voltage or current to be supplied to the conductors;
   first lead lines for connecting the first terminal to an output of the drive circuit, and a pair of lead lines for leading the second terminal and the third terminal to a second circuit apparatus, respectively;
   a detection circuit, disposed outside the wiring board, for detecting a voltage or current generated in a conductor; and
   the second circuit apparatus, attached to the first circuit apparatus, including a detection circuit for detecting a voltage or current generated in the conductors and a switch connected to the pair of lead lines of the first circuit apparatus for switching between an operation for short-circuiting the pair of lead lines and an operation for connecting one of the pair of the lead lines which is connected to the second terminal to an input of the detection circuit.

3. A wiring apparatus according to claim 2, wherein the drive circuit is an integrated circuit chip and the first circuit apparatus is a tape carrier package mounting the integrated circuit chip.

4. A wiring apparatus according to claim 3, wherein the switch of the second circuit apparatus is connected to the tape carrier package on a side opposite to the wiring board.

5. A wiring apparatus according to claim 2, wherein the second terminal of the wiring board and the switch of the second circuit apparatus are provided in a plurality of second terminals and a plurality of switches, the plurality of switches being successively switched so as to connect an associated second terminal to an input of the detection circuit.

6. A wiring apparatus according to claim 2, wherein the detection circuit has two inputs and detects a voltage between the two inputs or a current passing between the two inputs when connected, and wherein said display apparatus further comprises a circuit for short-circuiting two conductors connected to associated second terminals when the second terminals are provided in at least two second terminals and are connected to the two inputs.

7. A wiring apparatus according to claim 2, wherein the plurality of conductors are divided into a plurality of groups of conductors.

8. A wiring apparatus according to claim 7, wherein the detection circuit is a common detection circuit to the plurality of groups of conductors.

9. A wiring board according to claim 1, wherein the wiring board is a display panel and the plurality of conductors comprise scanning lines and signal lines.

* * * * *